United States Patent
Shiomi

(10) Patent No.: US 10,109,936 B2
(45) Date of Patent: Oct. 23, 2018

(54) ELECTRONIC DEVICE

(71) Applicant: DENSO CORPORATION, Kariya, Aichi-pref. (JP)

(72) Inventor: Takumi Shiomi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/708,316

(22) Filed: Sep. 19, 2017

(65) Prior Publication Data

US 2018/0183160 A1    Jun. 28, 2018

(30) Foreign Application Priority Data

Dec. 26, 2016   (JP) .................. 2016-251789

(51) Int. Cl.
| | |
|---|---|
| *H01R 12/00* | (2006.01) |
| *H01R 12/58* | (2011.01) |
| *H05K 1/02* | (2006.01) |
| *H05K 1/11* | (2006.01) |
| *H05K 1/18* | (2006.01) |

(52) U.S. Cl.
CPC ......... *H01R 12/585* (2013.01); *H05K 1/0203* (2013.01); *H05K 1/116* (2013.01); *H05K 1/181* (2013.01)

(58) Field of Classification Search
CPC ........ H01R 12/585; H01R 4/26; H05K 1/116; H05K 1/115; H05K 1/181
USPC ...................................... 439/76.1
See application file for complete search history.

(56) References Cited

U.S. PATENT DOCUMENTS

| | | | | |
|---|---|---|---|---|
| 5,896,270 A | * | 4/1999 | Tsui | H01L 23/4093 165/80.2 |
| 8,932,090 B2 | * | 1/2015 | Jaeckle | H01R 4/26 439/866 |
| 9,166,310 B2 | * | 10/2015 | Ludwig | H01R 12/585 |
| 2007/0093143 A1 | * | 4/2007 | Nomura | H01R 12/585 439/751 |
| 2009/0239398 A1 | * | 9/2009 | Lynch | H01R 12/585 439/81 |
| 2011/0115001 A1 | * | 5/2011 | Fujii | H01L 23/3677 257/288 |
| 2016/0072207 A1 | * | 3/2016 | Okada | H01R 12/585 439/81 |
| 2016/0380367 A1 | * | 12/2016 | Miyake | H05K 1/115 174/266 |
| 2017/0077627 A1 | * | 3/2017 | Matsumoto | H01R 12/585 |

FOREIGN PATENT DOCUMENTS

| | | |
|---|---|---|
| JP | 2009-289447 A | 12/2009 |
| JP | 2016-046270 A | 4/2016 |

* cited by examiner

*Primary Examiner* — Jean F Duverne
(74) *Attorney, Agent, or Firm* — Posz Law Group, PLC

(57) ABSTRACT

An electronic device includes a press-fit terminal, an electronic component and a substrate. The substrate includes a first through hole, a second through hole and an inlay. The press-fit terminal is press-fitted in the first through hole. The second through hole is located between the first through hole and a part of the substrate at which the electronic component is mounted. The inlay is made of a metal material and press-fitted in the second through hole. The inlay restricts a strain in the substrate and restricts decrease of a holding force of the substrate holding the press-fit terminal.

18 Claims, 6 Drawing Sheets

ELECTRONIC DEVICE

CROSS REFERENCE TO RELATED APPLICATION

This application is based on Japanese Patent Application No. 2016-251789 filed on Dec. 26, 2016, the disclosure of which is incorporated herein by reference.

TECHNICAL FIELD

The present disclosure relates to an electronic device that includes a substrate having a through hole and a press-fit terminal press-fitted in the through hole.

BACKGROUND

JP 2009-289447 A discloses an electronic device that includes a substrate having a through hole and a press-fit terminal press-fitted in the through hole. The electronic device includes multiple press-fit terminals. The substrate has multiple through holes corresponding to the multiple press-fit terminals. The substrate has dummy holes between neighboring through holes and the press-fit terminals are not press-fitted in the dummy holes.

SUMMARY

The press-fit terminal is press-fitted in the through hole and applies a reaction force of elastic deformation to a wall surface of the through hole. As such, the press-fit terminal is held by the substrate. When the press-fit terminal is press-fitted into the through hole, the through hole is deformed and a strain is generated in the substrate.

The dummy hole restricts the strain in the substrate. However, depending on usage environment, the dummy hole is deformed by a reaction force of elastic deformation and the above described reaction force of the press-fit terminal is reduced. That is, a holding force of the substrate holding the press-fit terminal is reduced.

It is an object of the present disclosure to provide an electronic device capable of restricting a strain in a substrate while restricting decrease of a holding force of the substrate holding a press-fit terminal.

According to an aspect of the present disclosure, an electronic device includes a press-fit terminal, an electronic component and a substrate. The substrate includes a first through hole, a second through hole and an inlay. The press-fit terminal is press-fitted in the first through hole. The second through hole is located between the first through hole and a part of the substrate at which the electronic component is mounted. The inlay is made of a metal material and press-fitted in the second through hole.

According to another aspect of the present disclosure, an electronic device includes a press-fit terminal and a substrate. The substrate includes a first through hole, a wiring, a second through hole and an inlay. The press-fit terminal is press-fitted in the first through hole. The second through hole is located between the first through hole and the wiring. The inlay is made of a metal material and press-fitted in the second through hole.

According to further another aspect of the present disclosure, an electronic device includes a press-fit terminal and a substrate. The substrate includes a first through hole, a second through hole and an inlay. The press-fit terminal is press-fitted in the first through hole. The inlay is made of a metal material and press-fitted in the second through hole. The inlay is lined up with the first through hole in an elastic direction of elastic deformation of the press-fit terminal.

According to the above aspects of the present disclosure, the inlay is press-fitted in the second through hole of the substrate. The inlay is less likely to be deformed. Therefore, the inlay restricts a strain in the substrate generated when the press-fit terminal is press-fitted into the first through hole. According to the above aspects of the present disclosure, differently from the conventional art, the dummy hole is not provided. Therefore, decrease of the holding force of the substrate holding the press-fit terminal is restricted.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Embodiments of the present disclosure will be described with reference to the drawings. In the following embodiments, portions functionally and/or structurally corresponding to each other will be designated with the same symbols. Hereinafter, a thickness direction of a substrate is referred to as Z direction. A direction orthogonal to the Z direction and corresponding to a width direction of a press-fit terminal is referred to as X direction. A direction orthogonal to the Z direction and the X direction is referred to as Y direction. Unless otherwise noted, a planar shape is a shape of a plane viewed in the Z direction (i.e., a shape of a plane extending along XY plane).

First Embodiment

First, a schematic structure of an electronic device according to a first embodiment will be described with reference to FIG. 1 and FIG. 2.

Figure 1:
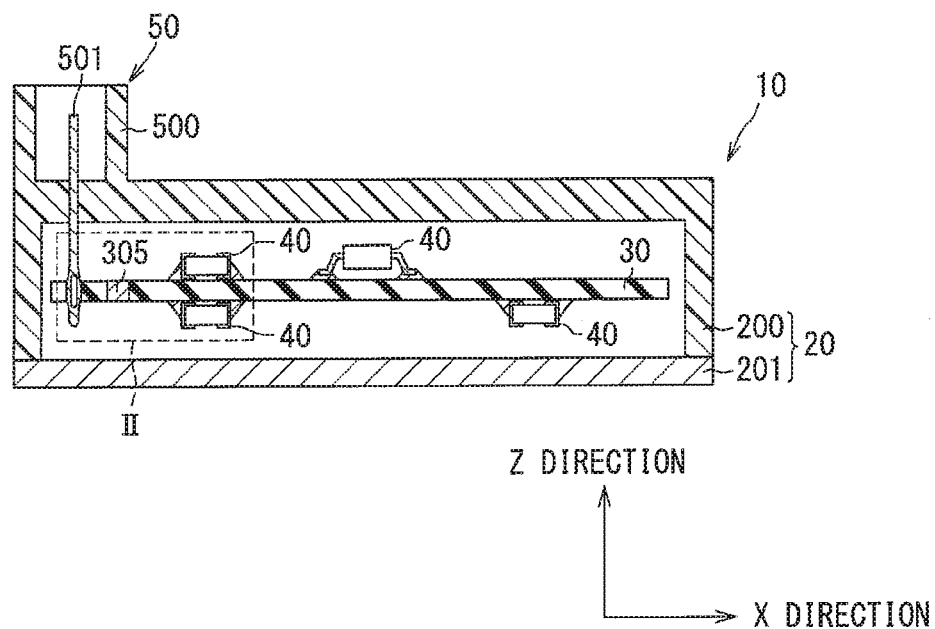
FIG. 1 is a cross-sectional view illustrating a schematic structure of an electronic device according to a first embodiment.

An electronic device 10 shown in FIG. 1 is an electronic control unit (ECU) controlling a vehicle. For example, the electronic device 10 is an engine ECU. The electronic device 10 includes an enclosure 20, a substrate 30, electronic components 40 and a connector 50.

The enclosure 20 accommodates the substrate 30 and the electronic components 40 to protect the substrate 30 and the electronic components 40. For example, the enclosure 20 is made of a metal material such as aluminum or iron in order to improve heat dissipation performance of heat generated in the electronic components 40. For example, the enclosure 20 is made of resin material in order to reduce a weight of the electronic device 10.

In the present embodiment, the enclosure 20 includes two members divided in the Z direction, that is, a case 200 and a cover 201. The case 200 is made of resin material and the cover 201 is made of material including aluminum. The enclosure 20 is provided by assembling the case 200 and the cover 201 in the Z direction. The case 200 has a box shape and one surface of the case 200 has an opening. The cover 201 occludes the opening of the case 200. A method for assembling the case 200 and the cover 201 is not especially limited. Well-known methods such as screw fixing or engagement may be employed.

The substrate 30 is a so-called printed substrate. The substrate 30 includes a base 300 and wirings arranged on the base 300. The base 300 is made of an electrical insulation material such as resin. In FIG. 1, illustrations of the wirings are omitted. FIG. 2 shows a land of the wirings of the substrate 30 employed for external connections. The substrate 30 is fixed to the enclosure 20 by well-known fixing methods such as screw fixing or adhesion.

Figure 2:
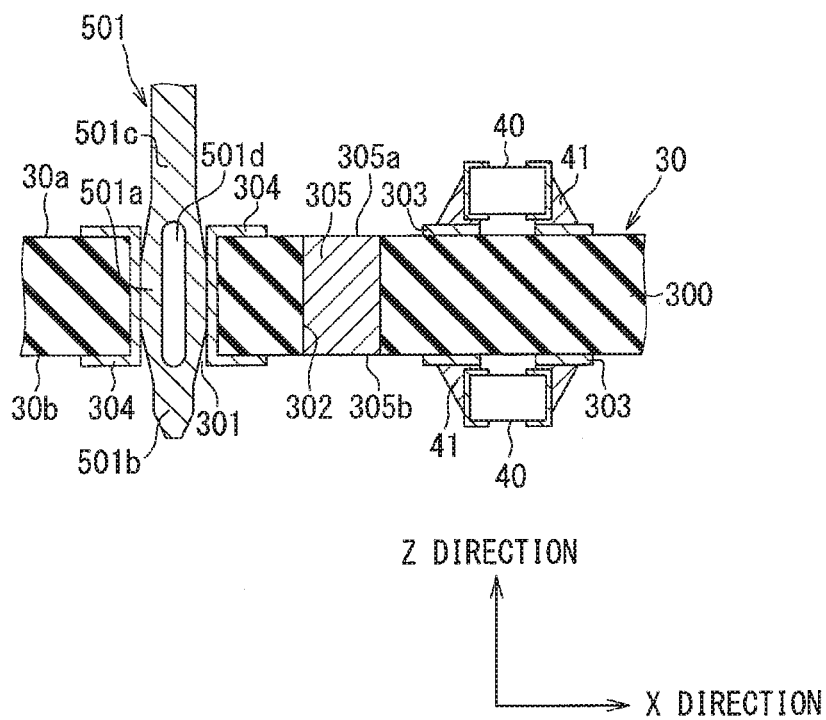
FIG. 2 is an enlarged diagram of a region II of FIG. 1.

As shown in FIG. 2, the substrate 30 has a first through hole 301 and a second through hole 302. The first through hole 301 and the second through hole 302 penetrate the substrate 30 in the Z direction corresponding to a thickness direction of the substrate 30. The first through hole 301 and the second through hole 302 have almost planar exact circle shape. The first through hole 301 is a hole in which a press-fit terminal 501, which will be described later, is inserted. The first through hole 301 may be referred to as a through hole. Both the first through hole 301 and the second through hole 302 have openings at a first surface 30a and a second surface 30b opposite to the first surface 30a of the substrate 30.

The substrate 30 has surface lands 303 and a through hole land 304 as the land. The surface lands 303 are formed on at least one of the first surface 30a and the second surface 30b. The through hole land 304 is formed on a wall surface of the first through hole 301. The through hole land 304 is integrally formed on the wall surface of the first through hole 301 and on a periphery of each opening of the first through hole 301 at the first surface 30a and the second surface 30b. That is, the through hole land 304 includes a wall portion formed on the wall surface of the first through hole 301 and a periphery portion formed on the periphery of each opening of the first through hole 301. The through hole land 304 is formed of a plating film. The through hole land 304 may be referred to as a through hole plating. The substrate 30 has the wirings other than the through hole land 304 only on the first surface 30a and the second surface 30b. That is, the substrate 30 is a double-sided wiring substrate without inner wirings (in other words, two-layer substrate).

The substrate 30 further includes an inlay 305. The inlay 305 is press-fitted in the second through hole 302 and held by the substrate 30. For example, the inlay 305 is press-fitted in the second through hole 302 by inserting the inlay 305 into the second through hole 302, and then pressurizing the inlay 305 by a pressing machine to enlarge a diameter of the inlay 305. The inlay 305 is made of a metal material having good heat conductivity such as copper. Therefore, the inlay 305 may be referred to as a metal member or a metal pin. In the present embodiment, the inlay 305 has a cylindrical shape. An entire length of the inlay 305 is almost the same as the thickness of the substrate 30. A first end face 305a of the inlay 305 is almost the same plane as the first surface 30a of the substrate 30. A second end face 305b of the inlay 305 is almost the same plane as the second surface 30b of the substrate. In other words, the first end face 305a is a part of the first surface 30a and the second end face 305b is a part of the second surface 30b. The first end face 305a and the second end face 305b are exposed surfaces.

The electronic components 40 are mounted on the substrate 30. The electronic components 40 provide circuits with the wirings formed on the substrate 30. The substrate 30 on which the electronic components 40 are mounted is a circuit board. The electronic components 40 are surface-mount-type components. The electronic components 40 are connected to the surface lands 303 through solders 41.

The connector 50 electrically connects the circuits provided by the wirings of the substrate 30 and the electronic components 40 to external devices. The connector 50 includes a housing 500 and multiple terminals. In the present embodiment, the press-fit terminal 501 is employed as the terminals. The housing 500 is formed of resin material. In the present embodiment, the housing 500 is integrally formed with the case 200. However, the housing 500 of the connector 50 may be separated from the case 200.

The press-fit terminal 501 is held by the housing 500, for example, by press-fitting or insert-molding. Multiple press-fit terminals 501 are arranged in the Y direction. Each of the press-fit terminals 501 is respectively press-fitted into the first through hole 301. As such, the press-fit terminal 501 is held by the substrate 30. The press-fit terminal 501 is in contact with the through hole land 304 and presses the through hole land 304. The press-fit terminal 501 is inserted into the first through hole 301 from the first surface 30a of the substrate 30.

For example, the press-fit terminal 501 is formed by plating a metal base. For example, copper alloy such as phosphor bronze or copper are employed as the metal base. The metal base is formed by punching a metal plate. The press-fit terminal 501 includes an elastic part 501a, a front-end part 501b and a rear-end part 501c.

The elastic part 501a has elasticity in an elastic direction orthogonal to the Z direction corresponding to an insertion direction in which the press-fit terminal 501 is inserted into the first through hole 301. In the present embodiment, a thickness direction of the metal base corresponds to the Y direction and the elastic part 501a has elasticity in the X direction. At least a part of the elastic part 501a is located in the first through hole 301. The elastic part 501a applies a reaction force of elastic deformation, that is, a spring reaction force of the elastic part 501a to the wall surface of the first through hole 301. The front-end part 501b extends from the elastic part 501a and defines a front-end of the press-fit terminal 501 in the insertion direction. At least a part of the front-end part 501b protrudes from the second surface 30b of the substrate 30. The rear-end part 501c extends from the elastic part 501a in the insertion direction opposite to the front-end part 501b, that is, toward the housing 500.

In the present embodiment, the press-fit terminal 501 has a so-called needle-eye shape. The press-fit terminal 501 further includes an opening part 501d a part of which is held in the first through hole 301. The opening part 501d is a through hole that penetrates the metal base in the thickness direction of the metal base, i.e., Y direction. The opening part 501*d* has a long shape extending in the Z direction.

The press-fit terminal 501 is divided into a pair of beams by the opening part 501*d*. The maximum distance in the X direction between external surfaces of the pair of beams is greater than the inner diameter of the first through hole 301 before the press-fit terminal 501 is inserted into the first through hole 301. The distance in the X direction between the external surfaces of the pair of beams is increased from the rear-end part 501*c* toward middle of the elastic part 501*a* and decreased from the middle of the elastic part 501*a* towards the front-end part 501*b*. The elastic part 501*a* includes the pair of beams. The elastic part 501*a* is a portion around the opening part 501*d*. The elastic part 501*a* is elastically deformable when the press-fit terminal 501 is inserted into the first through hole 301.

Next, structures around the inlay 305 will be described with reference to FIG. 2 and FIG. 3. In order to clarify an elastic direction of the elastic deformation of the press-fit terminal 501, FIG. 3 shows a cross-section along the XY plane of the elastic part 501*a* located in the first through hole 301.

Figure 3:
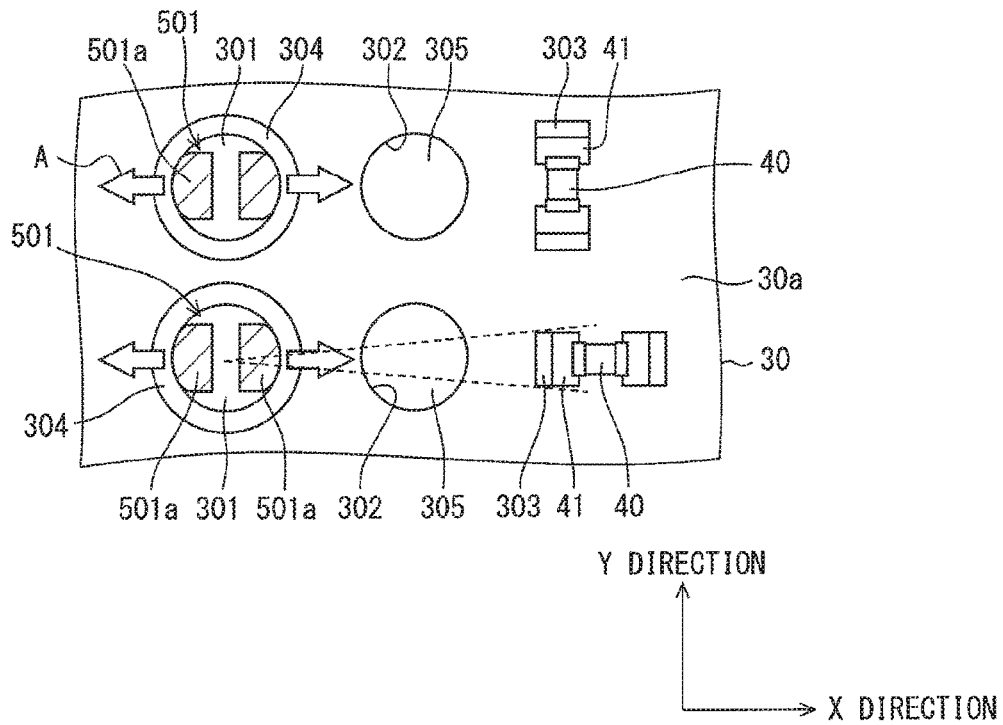
FIG. 3 is a cross-sectional view around an inlay.

As shown in FIG. 2 and FIG. 3, each of the electronic components 40 is mounted on the substrate 30 near the first through hole 301 in which the press-fit terminal 501 is press-fitted. In other words, the surface land 303, which is a part of the wirings, is arranged near the first through hole 301. In the present embodiment, the substrate 30 is the double-sided wiring substrate and the shortest distance from a center of the first through hole 301 to the surface land 303 is several millimeters (e.g., 5 mm).

The second through hole 302 is formed between the first through hole 301 and a mounted region of the electronic component 40. Specifically, the mounted region of the electronic component 40 is a part of the substrate 30 at which the electronic component 40 is mounted. The mounted region of the electronic component 40 includes a region corresponding to the electronic component 40 projected in the Z direction and a region at which the surface land 303 is formed. That is, the inlay 305 is located between the first through hole 301 and the mounted region of the electronic component 40 in the substrate 30. In the XY plane, at least a part of the inlay 305 is located within a region between two virtual lines (which are shown by broken lines in FIG. 3) connecting the center of the first through hole 301 and the mounted region of the electronic component 40.

Especially, in the present embodiment, the inlay 305 is located between the first through hole 301 and the mounted region of the electronic component 40 in the X direction corresponding to the elastic direction of the elastic deformation of the press-fit terminal 501. The inlay 305 is located between the first through hole 301 and the mounted region of the electronic component 40 lined up with the first through hole 301 in the X direction. When the press-fit terminal 501 is press-fitted into the first through hole 301, elastic deformation in the X direction occurs in the elastic part 501*a* of the press-fit terminal 501. In this case, as shown by a white arrow A in FIG. 3, a stress (i.e., compression stress) generated by the press-fitting of the press-fit terminal 501 is applied to the substrate 30 mainly in the X direction. The inlay 305 is lined up with the first through hole 301 in a direction in which the stress is applied, more specifically, in a direction of stress-applied-line in which the maximum stress is applied.

As shown in FIG. 3, multiple press-fit terminals 501 are arranged in the Y direction. Each of the press-fit terminals 501 has the elastic direction of elastic deformation in the X direction. Each inlay 305 is not located between the first through holes 301 adjoining in the Y direction. Each inlay 305 is located between the first through hole 301 and the electronic component 40.

Next, effects of the above described electronic device 10 will be described.

In the present embodiment, the electronic component 40 is mounted near the first through hole 301 in which the press-fit terminal 501 is press-fitted, and the second through hole 302 is formed between the electronic component 40 and the first through hole 301. The inlay 305 is press-fitted in the second through hole 302. The inlay 305 is formed of the metal material and less likely to be deformed than the base 300 providing the substrate 30. Therefore, when the press-fit terminal 501 is press-fitted into the first through hole 301, the inlay 305 is not deformed, while the first through hole 301 is deformed by the stress and the strain is generated in the substrate 30.

The strain is not generated at a portion of the substrate 30 farther from the first through hole 301 than the inlay 305 in the direction in which the first through hole 301 and the inlay 305 are lined up. Accordingly, the inlay 305 restricts the strain in the substrate 30. In other words, the stress applied to the substrate 30 by the press-fitting of the press-fit terminal 501 is blocked by the inlay 305. Therefore, the inlay 305 restricts a situation that the stress is applied to a connection portion of the electronic component 40 and the surface land 303 and connection reliability of the electronic component 40 is reduced.

As a result, the electronic component 40 may be located near the first through hole 301. That is, the substrate 30 is miniaturized by reducing a prohibition region at which the electronic component 40 is not mounted. For example, when a chip capacitor is located near the first through hole 301 as the electronic component 40, effect of reducing noise is enhanced.

Especially, in the present embodiment, the substrate 30 is the double-sided wiring substrate and the inner wiring layer is not disposed around the first through hole 301. Therefore, stiffness of the substrate 30 around the first through hole 301 is lower than a substrate having the inner wiring layer. The inlay 305 increases the stiffness of the substrate 30 and restricts the strain in the substrate 30.

In the present embodiment, the dummy hole is not provided in order to restrict the strain in the substrate 30. Therefore, a situation is restricted that the dummy hole is deformed by the spring reaction force of the press-fit terminal to reduce the spring reaction force and the holding force of the substrate holding the press-fit terminal is reduced. As described above, the electronic device 10 according to the present disclosure restricts the strain in the substrate 30 generated by the press-fitting of the press-fit terminal 501 and restricts the decrease of the holding force of the substrate 30 holding the press-fit terminal 501.

As described above, the press-fit terminal 501 is formed by plating the metal base made of phosphor bronze. The phosphor bronze has conductivity lower than, for example, pure copper. That is, the press-fit terminal 501 is likely to generate heat by energization. In the present embodiment, the inlay 305 is located near the press-fit terminal 501. For example, the heat is dissipated out of the substrate 30 from the second end face 305*b* of the inlay 305. Accordingly, the inlay 305 effectively dissipates the heat generated in the press-fit terminal 501.

Especially, in the present embodiment, in the direction of the elastic deformation of the press-fit terminal 501, the inlay 305 is located between the first through hole 301 and the mounted region of the electronic component 40. The inlay 305 is lined up with the first through hole 301 in the direction in which the stress generated by the press-fitting of the press-fit terminal 501 is applied. As a result, the inlay 305 effectively restricts the strain in the substrate 30. Accordingly, the inlay 305 effectively restricts the decrease of the connection reliability of the electronic component 40.

Figure 4:
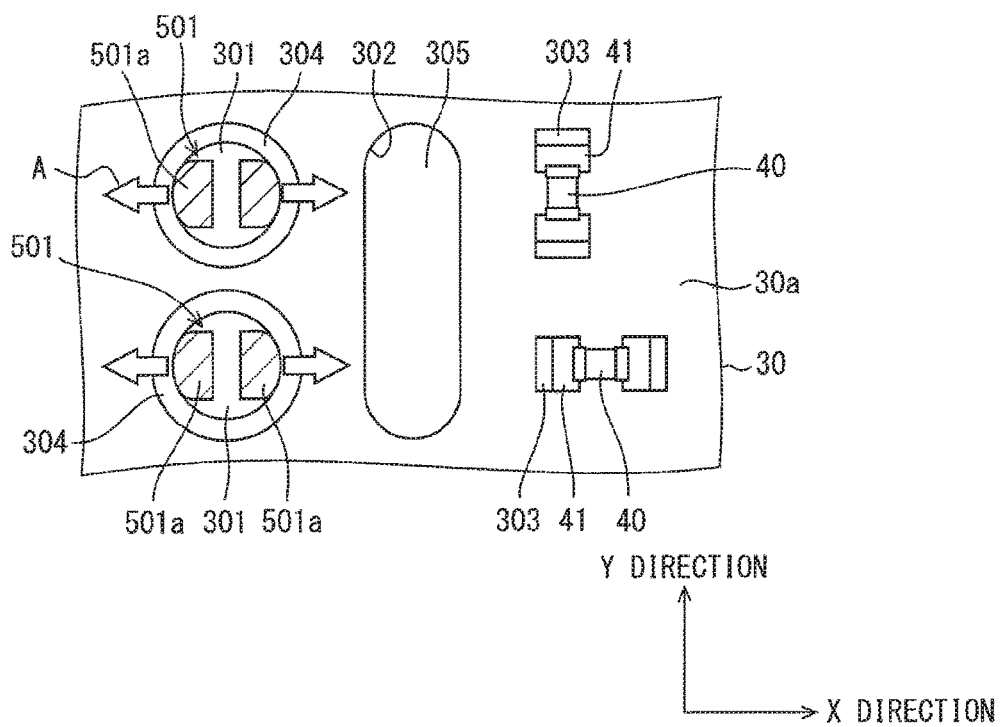
FIG. 4 is a cross-sectional view for illustrating a first modification.

Although an example is described in which each inlay 305 is respectively provided for the multiple first through holes 301, the present embodiment is not limited to the example. In a first modification shown in FIG. 4, the second through hole 302 is extended in the Y direction so that the second through hole 302 faces two first through holes 301 in the X direction. One inlay 305 blocks the stress generated by the press-fitting of two press-fit terminals 501. In the first modification, heat conductivity of the inlay 305 is increased and efficiency of dissipating the heat is increased. Also, the number of process for press-fitting the inlay 305 is reduced.

Second Embodiment

The present embodiment may refer to the previous embodiment. Parts that are common with the electronic device 10 described in the previous embodiment will not be repeatedly described.

Figure 5:
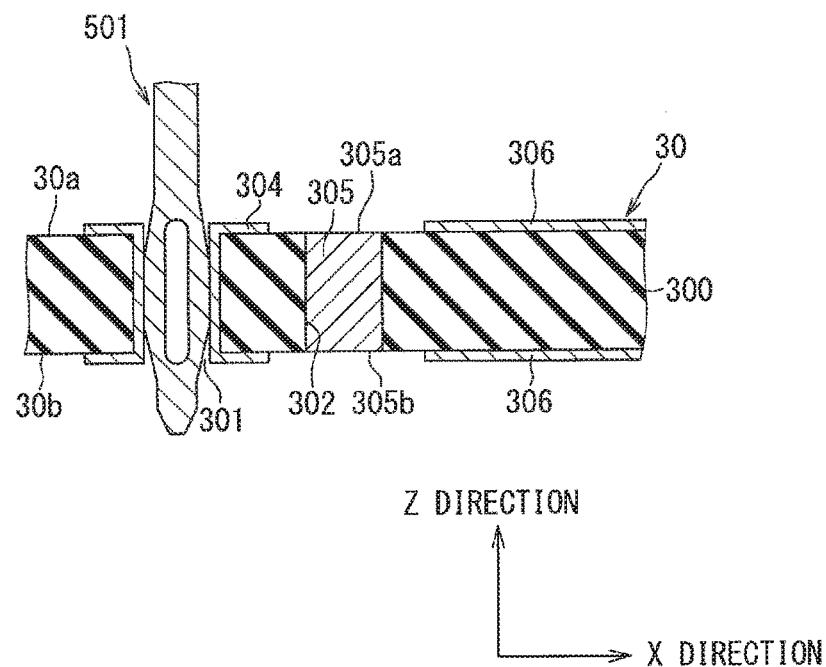
FIG. 5 is a cross-sectional view around an inlay of an electronic device according to a second embodiment.

In the present embodiment, as shown in FIG. 5, a wiring 306 is disposed on the substrate 30 near the first through hole 301 in which the press-fit terminal 501 is inserted. The wiring 306 is a part of the wirings disposed on the base 300 and is different from the lands. Also in the present embodiment, the substrate 30 is the double-sided wiring substrate. The wiring 306 is disposed on the first surface 30a and the second surface 30b near the first through hole 301.

The second through hole 302 is formed between the first through hole 301 and the wiring 306. That is, the inlay 305 is located between the first through hole 301 and the wiring 306. Although not illustrated, in the present embodiment, the inlay 305 is disposed between the first through hole 301 and the wiring 306 in the X direction corresponding to the direction of the elastic deformation of the press-fit terminal 501.

Similar effects to the first embodiment are achieved by the configuration of the second embodiment. For example, the inlay 305 is located between the first through hole 301 and the wiring 306. The inlay 305 restricts a situation that the stress generated by the press-fitting of the press-fit terminal 501 is applied to the wiring 306 and defect such as flaking occurs in the wiring 306. As a result, the wiring 306 may be disposed near the first through hole 301. Especially in the substrate 30 having the double-sided wiring structure, the stress of press-fitting is restricted from being applied to the wiring 306. Also in the present embodiment, the dummy hole is not provided. The strain in the substrate 30 generated by the press-fitting of the press-fit terminal 501 and the decrease of the holding force of the substrate 30 holding the press-fit terminal 501 are restricted. The inlay 305 efficiently dissipates the heat generated in the press-fit terminal 501.

In the present embodiment, the inlay 305 is disposed between the first through hole 301 and the wiring 306 in the direction of the elastic deformation of the press-fit terminal 501. The inlay 305 is lined up with the first through hole 301 in the direction in which the stress generated by the press-fitting of the press-fit terminal 501 is applied. That is, the inlay 305 effectively restricts the strain in the substrate 30. Accordingly, the inlay 305 effectively restricts the defect of the wiring 306.

The surface land 303 described in the first embodiment is also the wiring disposed near the first through hole 301 and is disposed similarly to the wiring 306 described in the present embodiment. Therefore, the inlay 305 also restricts the defect of the surface land 303.

Also in the present embodiment, the inlay 305 may be commonly provided for the multiple first through holes 301 as described in the first modification.

Third Embodiment

The present embodiment may refer to the previous embodiments. The parts that are common with the electronic device 10 of the previous embodiments will not be repeatedly described.

Figure 6:
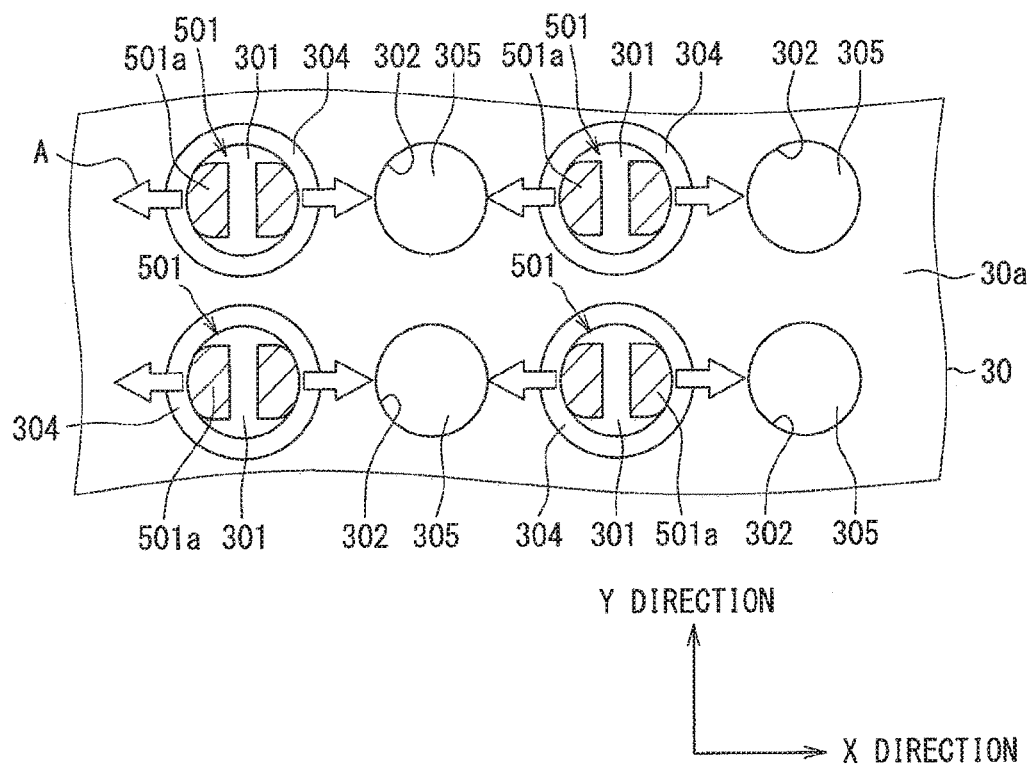
FIG. 6 is a cross-sectional view around an inlay of an electronic device according to a third embodiment.

In the present embodiment, as shown in FIG. 6, the inlay 305 is lined up with the first through hole 301 in the X direction corresponding to the direction of the elastic deformation of the press-fit terminal 501. Furthermore, multiple press-fit terminals 501 are arranged in the X direction. The inlays 305 are disposed between the neighboring first through holes 301 in the X direction.

Similar effects to the first embodiment are achieved by the configuration of the third embodiment. For example, each inlay 305 is lined up with the first through hole 301 in the direction in which the stress generated by the press-fitting of the press-fit terminal 501 is applied. The inlay 305 effectively restricts the strain in the substrate 30. Also in the present embodiment, the dummy hole is not provided. The strain in the substrate 30 generated by the press-fitting of the press-fit terminal 501 and the decrease of the holding force of the substrate 30 holding the press-fit terminal 501 are restricted. The inlay 305 efficiently dissipates the heat generated in the press-fit terminal 501.

In the present embodiment, each inlay 305 is disposed between the neighboring first through holes 301 in the X direction. The inlay 305 restricts the stress generated by the press-fitting of the press-fit terminal 501 from applying to the other first through holes 301. The inlay 305 restricts a situation that the first through hole 301 is deformed and, for example, the stress generated by the press-fitting of the press-fit terminal 501 is increased to be larger than a desired value.

Also in the present embodiment, the inlay 305 may be commonly provided for the multiple first through holes 301 as described in the first modification. In this case, the inlay 305 may be commonly provided for the multiple first through holes 301 lined up in the direction different from the direction of the elastic deformation.

Fourth Embodiment

The present embodiment may refer to the previous embodiments. The parts that are common with the electronic device 10 of the previous embodiments will not be repeatedly described.

Figure 7:
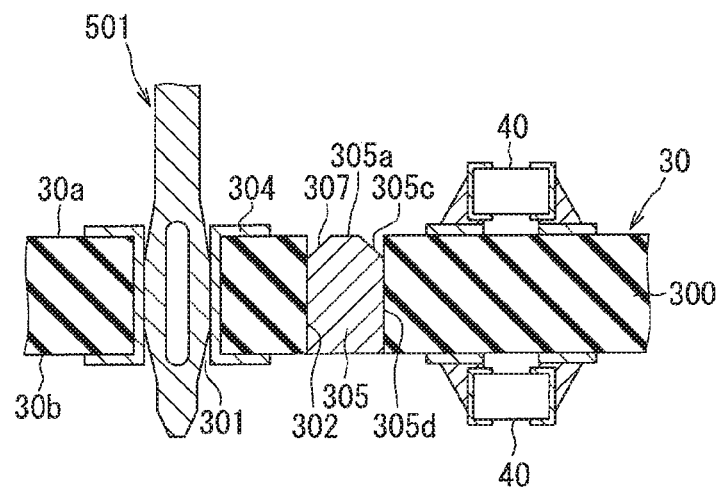
FIG. 7 is a cross-sectional view around an inlay of an electronic device according to a fourth embodiment.

In the present embodiment, the substrate 30 has a stress relaxation portion provided at the first surface 30a so as to relax the stress generated by the press-fitting of the press-fit terminal 501. In FIG. 7, the substrate 30 has a hollow 307 with a bottom as the stress relaxation portion. The hollow 307 is located between the first through hole 301 and the inlay 305. The hollow 307 is defined by a side surface of the inlay 305 and a wall surface of the second through hole 302.

The inlay 305 has a pillared shape. The inlay 305 has side surfaces 305c and 305d connecting the first end face 305a and the second end face 305b. The side surface 305c is communicated with the first end face 305a and the side surface 305d is communicated with the second end face 305b. The side surface 305c defines a tapered shape. External diameter of a part of the inlay 305 corresponding to the side surface 305c is increased with distance from the first end face 305a in the Z direction. A part of the inlay 305 corresponding to the side surface 305d has a constant external diameter along the entire length of the side surface 305d. In the Z direction, the side surface 305c is shorter than the side surface 305d.

The second through hole 302 has a constant inner diameter along the entire length of the side surface 305d. Accordingly, since the inlay 305 has the side surface 305c defining the tapered shape, the hollow 307 is provided between the side surface 305c of the inlay 305 and the wall surface of the second through hole 302.

Next, effects of the above described electronic device 10 will be described.

When the press-fit terminal 501 is press-fitted into the first through hole 301, the press-fit terminal 501 is initially in contact with an upper edge of the first through hole 301, that is, the opening at the first surface 30a. When the press-fit terminal 501 is press-fitted, the stress applied to the substrate 30 from the press-fit terminal 501 is increased at the first surface 30a. Especially, the stress is increased at a surface layer of the first surface 30a, for example, within 0.5 mm from the first surface 30a in the Z direction.

In the present embodiment, the part of the inlay 305 corresponding to the side surface 305c has the tapered shape and the hollow 307 opened toward the first surface 30a is provided between the first through hole 301 and the inlay 305. The hollow 307 allows the base 300 to be deformed and relaxes the stress generated when the press-fit terminal 501 is press-fitted.

The hollow 307 is opened only toward the first surface 30a among the first surface 30a and the second surface 30b. The hollow 307 is provided at the surface layer adjacent to the first surface 30a. Accordingly, the hollow 307 restricts the decrease of the holding force of the substrate 30 holding the press-fit terminal 501.

Although, in the present embodiment, an example is described in which the inlay 305 has the side surface 305c defining the tapered shape, the present disclosure is not limited to the example. The hollow 307 is provided by cutting a part of the first end face 305a of the inlay 305. The hollow 307 is also provided by changing the inner diameter of the second through hole 302 along the Z direction. Specifically, the hollow 307 is provided by enlarging the inner diameter of the second through hole 302 at a part of the first surface 30a than the second surface 30b.

The stress relaxation portion is not limited to the above example. For example, the stress relaxation portion may include the following modifications.

Figure 8:
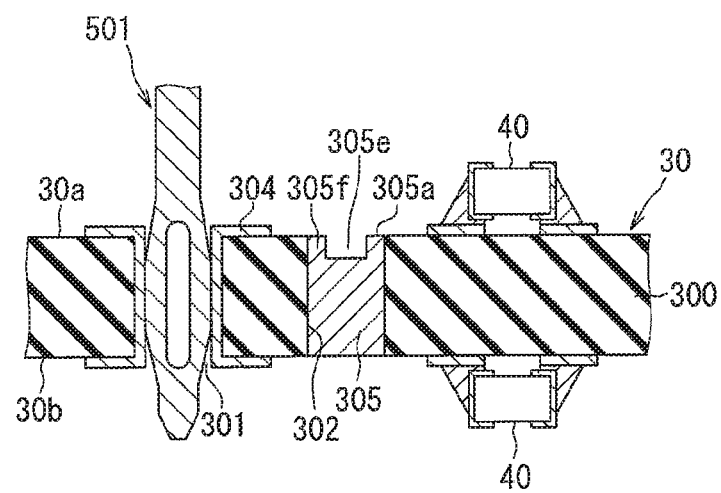
FIG. 8 is a cross-sectional view for illustrating a second modification.

In a second modification shown in FIG. 8, the stress relaxation portion is provided by a recess 305e having an opening at the first end face 305a of the inlay 305. The recess 305e provides a thin portion 305f at a periphery of the recess 305e. The thin portion 305f is elastically deformable. That is, the recess 305e relaxes the stress generated when the press-fit terminal 501 is press-fitted. The shape of the recess 305e is not limited to the example shown in FIG. 8.

Figure 9:
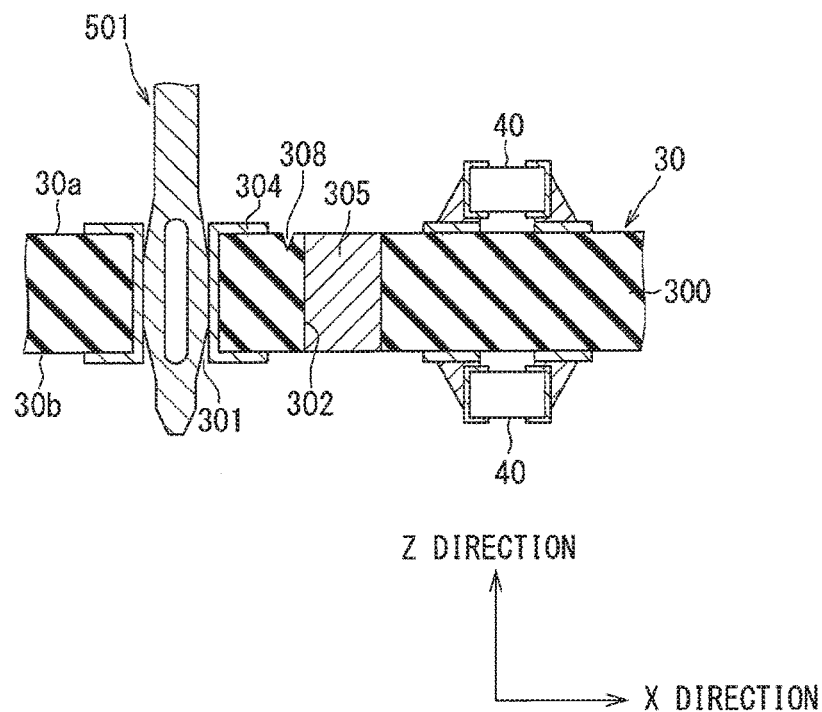
FIG. 9 is a cross-sectional view for illustrating a third modification.

In a third modification shown in FIG. 9, the stress relaxation portion is provided by a groove 308 formed at the first surface 30a of the substrate 30 between the first through hole 301 and the inlay 305. In this case, similarly to the hollow 307, the groove 308 relaxes the stress generated when the press-fit terminal 501 is press-fitted. Although the groove 308 has V shape in FIG. 9, the present disclosure is not limited to the example.

Figure 10:
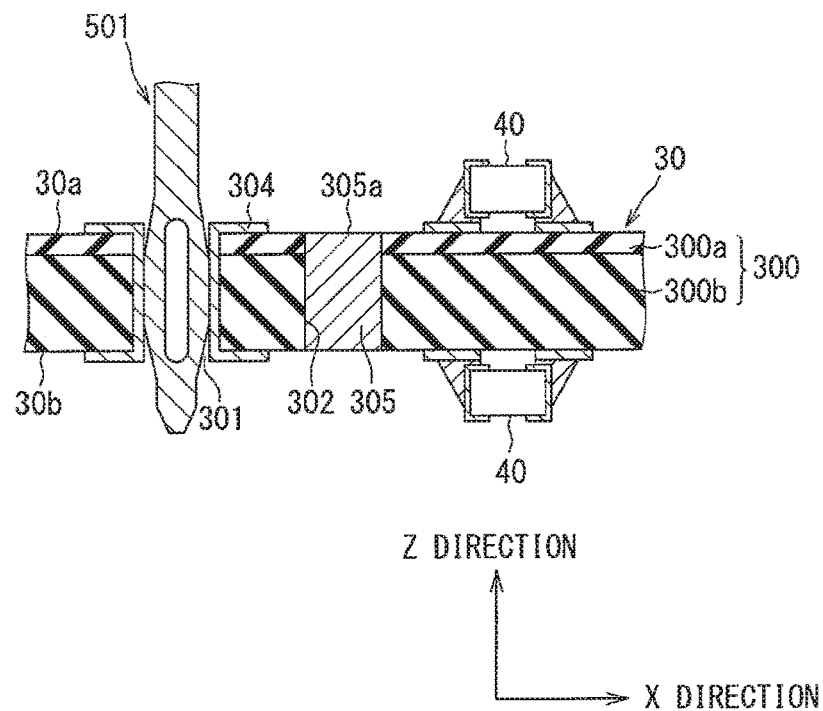
FIG. 10 is a cross-sectional view for illustrating a fourth modification.

In a fourth modification shown in FIG. 10, the substrate 30 includes multiple bases 300 layered. The multiple bases 300 include a first base 300a defining the first surface 30a of the substrate 30 and a second base 300b disposed below the first base 300a. The first base 300a has an elastic modulus lower than the second base 300b. The stress relaxation portion is provided by a part of the first base 300a located between the first through hole 301 and the inlay 305. The first base 300a having lower elastic modulus relaxes the stress. Although an example is described in which the first base 300a is entirely disposed at the first surface 30a in FIG. 10, the present disclosure is not limited to the example. The first base 300a is disposed at least between the first through hole 301 and the inlay 305.

Fifth Embodiment

The present embodiment may refer to the previous embodiments. The parts that are common with the electronic device 10 of the previous embodiments will not be repeatedly described.

Figure 11:
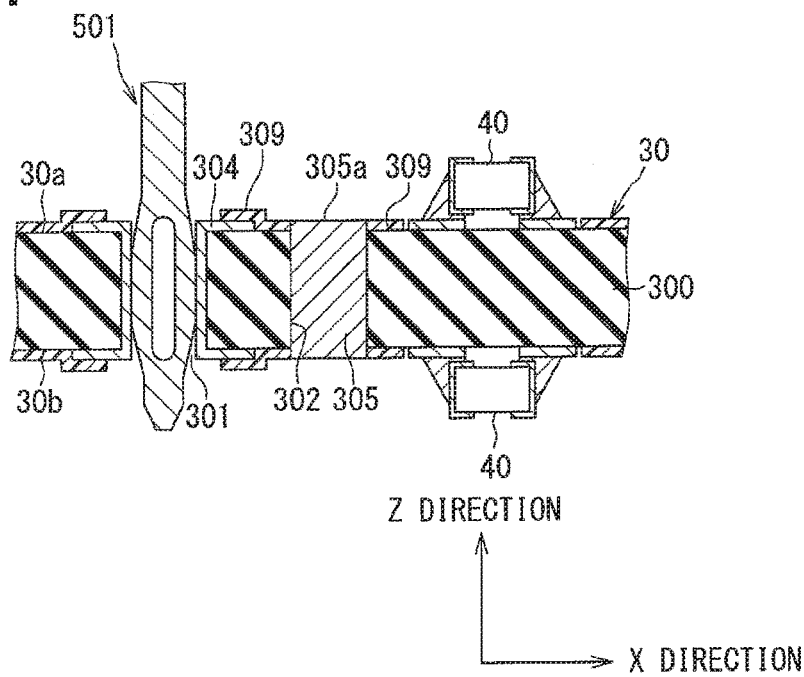
FIG. 11 is a cross-sectional view around an inlay of an electronic device according to a fifth embodiment.

As shown in FIG. 11, in the present embodiment, the substrate 30 has a solder resist 309 disposed on a surface of the base 300. The solder resist 309 covers at least a part of the periphery portion of the through hole land 304 located between the first through hole 301 and the inlay 305. In the present embodiment, the solder resist 309 covers the entire part of the periphery portion of the through hole land 304. Accordingly, the solder resist 309 has an over-resist structure on the periphery portion of the through hole land 304.

The inlay 305 blocks the stress generated when the press-fit terminal 501 is press-fitted. In this case, there is a possibility that the stress is applied to the through hole land 304. According to the present embodiment, the solder resist 309 covers the through hole land 304 at the periphery of the opening of the first surface 30a and the solder resist 309 restricts the defect of the through hole land 304 such as flaking.

Sixth Embodiment

The present embodiment may refer to the previous embodiments. The parts that are common with the electronic device 10 of the previous embodiments will not be repeatedly described.

Figure 12:
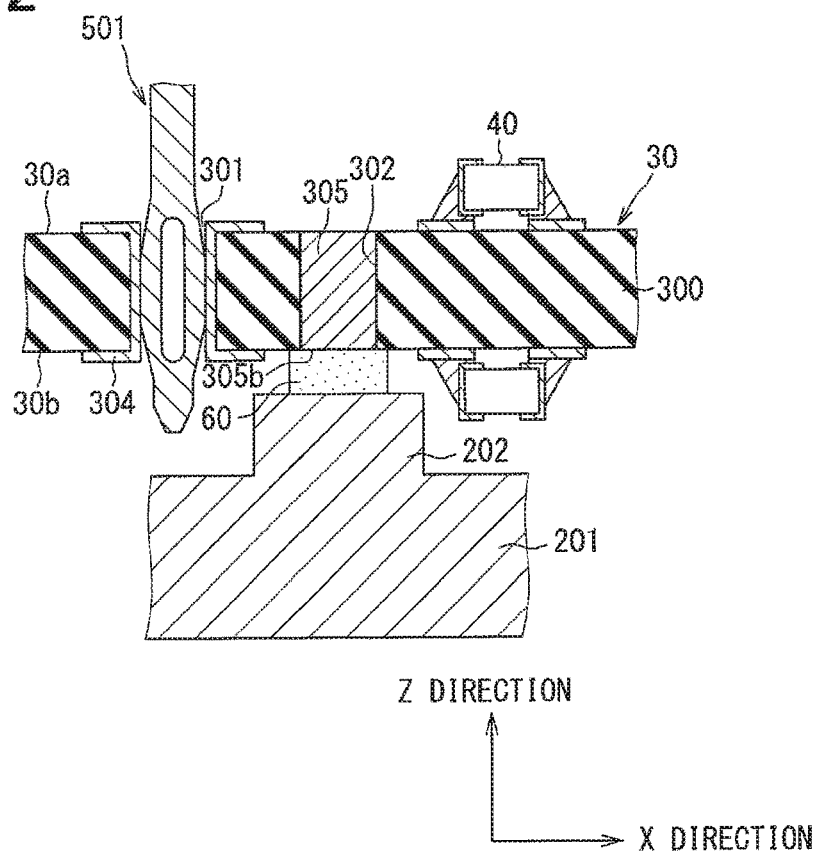
FIG. 12 is a cross-sectional view around an inlay of an electronic device according to a sixth embodiment.

In the present embodiment, as shown in FIG. 12, the cover 201 made of metal is connected to the second end face 305b of the inlay 305 through a heat conducting member 60 such as heat dissipating gel. The cover 201 has a protrusion 202 protruding toward an inner space of the enclosure 20. The protrusion 202 protrudes so as to face the second end face 305b of the inlay 305 in a state of the enclosure 20 accommodating the substrate 30. The heat conducting member 60 is interposed between a top surface of the protrusion 202 and the second end face of the inlay 305.

In the present embodiment, the cover 201 as a heat dissipating member is thermally connected to the inlay 305. The above described heat generated in the press-fit terminal 501 is released to the cover 201 through the inlay 305. Accordingly, the heat dissipating performance of the press-fit terminal 501 is improved. As a result, the quantity of energization of each press-fit terminal 501 is increased and the number of the press-fit terminals 501 is decreased.

The heat dissipating member is not limited to the cover 201. For example, a heat sink may be employed as the heat dissipating member.

The press-fit terminal 501 is not limited to the terminal of the connector 50.

The shape of the press-fit terminal 501 is not limited to the needle eye shape.

The electronic device 10 does not necessarily include the enclosure 20.

The electronic component 40 is not necessarily the surface-mount-type component. A through-hole-mount-type component may be employed. However, the present disclosure is more effective for the surface-mount-type component that is more likely to be affected by the stress of the press-fitting of the press-fit terminal 501.

The shape of the inlay 305 is not limited to the pillared shape.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. An electronic device comprising:
a press-fit terminal;
an electronic component; and
a substrate that includes a first through hole, a second through hole and an inlay, the press-fit terminal being press-fitted in the first through hole, the second through hole being located between the first through hole and a part of the substrate at which the electronic component is mounted, the inlay being made of a metal material and press-fitted in the second through hole, and the inlay being located in the second through hole, which is different from the first through hole.

2. The electronic device according to claim 1, wherein the inlay is located between the first through hole and the part of the substrate in an elastic direction of elastic deformation of the press-fit terminal.

3. The electronic device according to claim 1, wherein:
the first through hole and the second through hole respectively have openings at a first surface of the substrate and at a second surface of the substrate opposite to the first surface;
the press-fit terminal includes an elastic part, a front-end part and a rear-end part;
the elastic part has elasticity in an elastic direction orthogonal to an insertion direction in which the press-fit terminal is inserted in the first through hole;
at least a part of the elastic part is located in the first through hole;
the elastic part applies a reaction force of elastic deformation to a wall surface of the first through hole;
the front-end part extends from the elastic part in the insertion direction and defines a front-end of the press-fit terminal in the insertion direction;
at least a part of the front-end part protrudes from the second surface of the substrate; and
the rear-end part extends from the elastic part in the insertion direction opposite to the front-end part.

4. The electronic device according to claim 3, wherein:
the substrate includes a stress relaxation portion at the first surface; and
the stress relaxation portion is configured to relax a stress generated when the press-fit terminal is press-fitted.

5. The electronic device according to claim 4, wherein:
the stress relaxation portion is provided by a hollow with a bottom;
the hollow is located between the first through hole and the inlay; and
the hollow is defined by a side surface of the inlay and a wall surface of the second through hole.

6. The electronic device according to claim 4, wherein the stress relaxation portion is provided by a recess having an opening at an end face of the inlay adjacent to the first surface of the substrate.

7. The electronic device according to claim 4, wherein:
the stress relaxation portion is provided by a groove provided at the first surface of the substrate; and
the groove is located between the first through hole and the inlay.

8. The electronic device according to claim 4, wherein:
the substrate includes a plurality of bases layered, each having an electrical insulation property;
the plurality of bases includes a first base defining the first surface of the substrate and a second base disposed below the first base;
the first base has an elastic modulus lower than the second base; and
the stress relaxation portion is provided by a part of the first base located between the first through hole and the inlay.

9. The electronic device according to claim 3, wherein:
the substrate includes a land and a solder resist;
the land includes a wall portion provided on the wall surface of the first through hole and a periphery portion provided on a periphery of the opening of the first through hole at the first surface of the substrate;
the solder resist is provided on the first surface of the substrate; and
the solder resist covers at least a part of the periphery portion of the land located between the first through hole and the inlay.

10. The electronic device according to claim 1, further comprising:
a heat dissipating member that is made of a metal material and is thermally connected to the inlay.

11. The electronic device according to claim 1, wherein
the first through hole and the second through hole respectively have openings at a first surface of the substrate and at a second surface of the substrate opposite to the first substrate,
the substrate includes a stress relaxation portion at the first surface, and
the stress relaxation portion is configured to relax a stress generated when the press-fit terminal is press-fitted into the first through hole.

12. An electronic device comprising:
a press-fit terminal; and
a substrate that includes a first through hole, a wiring, a second through hole and an inlay, the press-fit terminal being press-fitted in the first through hole, the second through hole being located between the first through hole and the wiring, the inlay being made of a metal material and press-fitted in the second through hole, and the inlay being located in the second through hole, which is different from the first through hole.

13. The electronic device according to claim 12, wherein the inlay is located between the first through hole and the wiring in an elastic direction of elastic deformation of the press-fit terminal.

14. The electronic device according to claim 12, wherein:
the first through hole and the second through hole respectively have openings at a first surface of the substrate and at a second surface of the substrate opposite to the first surface;
the press-fit terminal includes an elastic part, a front-end part and a rear-end part;
the elastic part has elasticity in an elastic direction orthogonal to an insertion direction in which the press-fit terminal is inserted in the first through hole;
at least a part of the elastic part is located in the first through hole;
the elastic part applies a reaction force of elastic deformation to a wall surface of the first through hole;
the front-end part extends from the elastic part in the insertion direction and defines a front-end of the press-fit terminal in the insertion direction;
at least a part of the front-end part protrudes from the second surface of the substrate; and
the rear-end part extends from the elastic part in the insertion direction opposite to the front-end part.

15. The electronic device according to claim 12, further comprising:
a heat dissipating member that is made of a metal material and is thermally connected to the inlay.

16. An electronic device comprising:
a press-fit terminal; and
a substrate that includes a first through hole, a wiring, a second through hole and an inlay, the press-fit terminal being press-fitted in the first through hole, the second through hole being located between the first through hole and the wiring, the inlay being made of a metal material and press-fitted in the second through hole, and the inlay being located in the second through hole, which is different from the first through hole.

17. The electronic device according to claim 16, wherein:
the first through hole and the second through hole respectively have openings at a first surface of the substrate and at a second surface of the substrate opposite to the first surface;
the press-fit terminal includes an elastic part, a front-end part and a rear-end part;
the elastic part has elasticity in the elastic direction orthogonal to an insertion direction in which the press-fit terminal is inserted in the first through hole;
at least a part of the elastic part is located in the first through hole;
the elastic part applies a reaction force of elastic deformation to a wall surface of the first through hole;
the front-end part extends from the elastic part in the insertion direction and defines a front-end of the press-fit terminal in the insertion direction;
at least a part of the front-end part protrudes from the second surface of the substrate; and
the rear-end part extends from the elastic part in the insertion direction opposite to the front-end part.

18. The electronic device according to claim 16, further comprising:
a heat dissipating member that is made of a metal material and is thermally connected to the inlay.

* * * * *